(12) United States Patent
Kobayashi et al.

(10) Patent No.: US 8,076,687 B2
(45) Date of Patent: Dec. 13, 2011

(54) LIGHT EMITTING DEVICE FOR IMPROVING THE COLOR PURITY OF EMITTED LIGHT AND ELECTRONIC APPARATUS

(75) Inventors: Hidekazu Kobayashi, Azumino (JP); Koya Shiratori, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 169 days.

(21) Appl. No.: 12/428,009

(22) Filed: Apr. 22, 2009

(65) Prior Publication Data
US 2009/0283786 A1    Nov. 19, 2009

(30) Foreign Application Priority Data

May 14, 2008   (JP) .................................. 2008-127744

(51) Int. Cl.
*H01L 33/00*    (2010.01)

(52) U.S. Cl. ............................. 257/98; 257/99; 257/100

(58) Field of Classification Search ............. 257/98–100
See application file for complete search history.

(56) References Cited

U.S. PATENT DOCUMENTS

| | | | | |
|---|---|---|---|---|
| 6,025,894 A | * | 2/2000 | Shirasaki et al. | 349/69 |
| 6,657,687 B2 | * | 12/2003 | Takizawa | 349/106 |
| 6,867,831 B2 | * | 3/2005 | Takizawa et al. | 349/106 |
| 7,166,872 B2 | * | 1/2007 | Miyazawa | 257/98 |
| 7,218,049 B2 | | 5/2007 | Yamada et al. | |

FOREIGN PATENT DOCUMENTS
WO    WO 01/39554 A1    5/2001

* cited by examiner

*Primary Examiner* — Wai Sing Louie
*Assistant Examiner* — Bilkis Jahan
(74) *Attorney, Agent, or Firm* — Oliff & Berridge, PLC

(57) ABSTRACT

A light emitting device includes: a light emitting element which includes a first electrode layer, a second electrode layer, and a light emitting function layer disposed between the first electrode and the second electrode; a reflection layer which reflects light emitted from the light emitting function layer toward the light emitting function layer; and a translucent transflective layer which is disposed opposite the reflection layer with the light emitting function layer interposed therebetween to reflect some of the light emitted from the light emitting function layer toward the light emitting function layer and to transmit the remainder of the light. The translucent transflective layer is centered between a first layer having a refractive index n1 and being disposed on a side of the reflection layer and a second layer having a refractive index n2 (where n2<n1) and being disposed opposite the first layer.

10 Claims, 6 Drawing Sheets

| | EMBODIMENT | | COMPARATIVE EXAMPLE | |
|---|---|---|---|---|
| | WAVELENGTH OF EMITTED LIGHT (nm) | HALF WIDTH (nm) | WAVELENGTH OF EMITTED LIGHT (nm) | HALF WIDTH (nm) |
| B | 468 | 30 | 468 | 33 |
| G | 530 | 33 | 532 | 49 |
| R | 610 | 20 | 610 | 23 |

| |
|---|
| −3 |
| −16 |
| −3 |

| | | EMBODIMENT | | COMPARATIVE EXAMPLE | |
|---|---|---|---|---|---|
| | | WAVELENGTH OF EMITTED LIGHT (nm) | HALF WIDTH (nm) | WAVELENGTH OF EMITTED LIGHT (nm) | HALF WIDTH (nm) |
| B | | 467.7 | 29.8 | 467.7 | 34 |
| G | | 532 | 30.6 | 534.9 | 42.1 |
| R | | 606.9 | 20.2 | 610 | 21.5 |

| |
|---|
| −4.2 |
| −11.5 |
| −1.3 |

LIGHT EMITTING DEVICE FOR IMPROVING THE COLOR PURITY OF EMITTED LIGHT AND ELECTRONIC APPARATUS

BACKGROUND

1. Technical Field

The present invention relates to a light emitting device which emits light by electro Luminescence and an electronic apparatus.

2. Related Art

As a thin lightweight light emitting source, an OLED (Organic Light Emitting Diode), that is, an organic EL (Electroluminescent) element has been popular. Accordingly, an image display apparatus including a plurality of the organic EL elements has been developed. The organic EL element has a configuration in which at least one organic thin film layer made of an organic material is interposed between pixel electrodes and counter electrodes.

In a field of the organic EL element, there is known a technique (for example, a PCT pamphlet No. WO01/39554) for intensifying light having a specific wavelength among emitted light by use of amplified interference, that is, resonance. This technique is capable of increasing color purity of a luminescent color or improving efficiency of light emitted in response to light emission.

However, in order to effectively achieve the improvement in the color purity by use of the resonance, a problem with an increase in an absolute amount of light associated with the resonance or an increase in reflectivity of two reflection layers provided in order to realize the resonance has to be solved.

In order to solve this problem, a method of increasing the thickness of the reflection layer can be taken into consideration. However, since at least one of the two reflection layers needs to have a light reflection feature and a light transmission feature, the method of increasing the thickness of the reflection layer (even though reflectivity is expected to be improved) may result in decreasing an amount of transmitting light. In this case, since the image display apparatus may display a relatively darker image, a new problem with image deterioration may occur.

SUMMARY

An advantage of some aspects of the invention is that it provides a light emitting device and an electronic apparatus including the light emitting device.

According to an aspect of the invention, there is provided a light emitting device including: a light emitting element which includes a first electrode layer, a second electrode layer, and a light emitting function layer disposed between the first electrode and the second electrode; a reflection layer which reflects light emitted from the light emitting function layer toward the light emitting function layer; and a translucent transflective layer which is disposed opposite the reflection layer with the light emitting function layer interposed therebetween to reflect some of the light emitted from the light emitting function layer toward the light emitting function layer and to transmit the remainder of the light. The translucent transflective layer is centered between a first layer having a refractive index n1 and being disposed on a side of the reflection layer and a second layer having a refractive index n2 (where n2<n1) and being disposed opposite the first layer.

In the light emitting device according to this aspect of the invention, color purity of light emitted from the light emitting device can be further improved. The reason is as follows.

That is, the light emitting device according to this aspect of the invention includes a resonator structure formed by the light emitting element, the reflection layer, and the translucent transflective layer. In addition, the translucent transflective layer is interposed between the first layer and the second layer and the refractive indexes n1 and n2 satisfy a relation of n1>n2. Accordingly, when a layer (hereinafter, also referred to as "a transflective (which is an abbreviation of transmissive and reflective) structure layer" for simplification) including all three layers, that is, the first layer, the translucent transflective layer, and the second layer is considered to be used, light incident and coming from the inside of the resonator structure is reflected from the corresponding layer under a condition close to a total reflection condition.

With such a configuration, there is a high possibility of increasing an absolute amount of light associated with a resonation phenomenon. Accordingly, according to this aspect of the invention, an effect of improving the color purity is achieved.

In the light emitting device according to this aspect of the invention, the first layer may include the whole or a part of the light emitting function layer.

With such a configuration, the first layer includes the whole or the part of the light emitting function layer, that is, the first layer and the whole or the part of the light emitting function layer are configured to be common or combined, the efficiency and simplification of the device configuration are designed and manufacture easiness is improved. In other words, according to this aspect of the invention, a problem with a complication of the device configuration caused due to an increase in the constituent element of "the first layer" and manufacture difficulty does not occur.

In the light emitting device according to this aspect of the invention, the translucent transflective layer may include the second electrode layer and serves as cathode. In addition, the first layer may include at least one of an electron transport layer and an electron injection layer as a part of the light emitting function layer.

With such a configuration, the translucent transflective layer and the first electrode layer are common and combined, as the first layer and the light emitting function layer are common and combined. Accordingly, the efficiency and simplification of the device configuration are designed and manufacture easiness is improved.

In the light emitting device according to this aspect of the invention, an optical distance from the reflection layer to an interface opposite the reflection layer in the translucent transflective layer may be determined on the basis of d calculated by Expression (1):

$$2d + \phi_D + \phi_U = m\lambda \tag{1}$$

where $\lambda$ is a wavelength set as a resonance target, $\phi_D$ is a phase change when light having a wavelength $\lambda$ and traveling from the light emitting function layer to the reflection layer is reflected from the reflection layer, and $\phi_U$ is a phase change when light having a wavelength $\lambda$ and traveling from the light emitting function layer to the translucent transflective layer is reflected from the translucent transflective layer, and m is a positive integer.

With such a configuration, the resonator structure formed by the light emitting element, the reflection layer, and the transflective structure layer can appropriately generate the resonation phenomenon.

The phrase "a wavelength set as a resonation target" (hereinafter, "a resonance target wavelength") means that when the light emitting device according to this aspect of the invention is provided with plural light emitting elements and the plural light emitting elements display three red, green, and blue (RGB) colors, for example, wavelengths of the three colors can be used. That is, assuming that the wavelengths of the three colors are $\lambda r$, $\lambda g$, and $\lambda b$ (where $\lambda r \neq \lambda g \neq \lambda b$), $\lambda$ can take one of $\lambda r$, $\lambda g$, and $\lambda b$. Accordingly, d can take a specific value, that is, dr, dg, or db (where $dr \neq dg \neq db$) in accordance with the wavelengths (in this case, "d" is sometimes different in every light emitting element).

With such a configuration, in order to realize the three color display, as described above, "color filters which are disposed opposite the light emitting function layer with the translucent transflective layer interposed therebetween and transmit light transmitted through the translucent transflective layer may be further included. In this case, the resonance target wavelength $\lambda$ can be set as "a wavelength corresponding to peak of transmissivity of the color filters", for example.

In the light emitting device according to this aspect of the invention, the thickness of the translucent transflective layer may be in the range of 5 to 20 [nm].

With such a configuration, since the translucent transflective layer is very thin, as described above, a light reflection phenomenon appropriately occurs on the interface between the first and second layers. Therefore, transmission and reflection phenomenon can appropriately occur in the transflective structure layer. Accordingly, since the resonance phenomenon is enhanced in this configuration, the above-described effect of improving the color purity can be achieved more effectively. In addition, in this configuration, since a transmission ratio of light is maintained and improved thanks to the same reason (that is, the decrease in the thickness of the translucent transflective layer), a problem with image deterioration such as deterioration in image brightness is reduced.

The meaning of the lower limit value of 5 [nm] and the upper limit value of 20 [nm] in the range will be described below in an embodiment.

In the light emitting device according to this aspect of the invention, the second layer may be made of a material having a light transmitting property.

With such a configuration, since the second layer is made of the material having the light transmitting property, use efficiency of light is considerably improved. That is, light generated in the light emitting function layer is light forming an image in such a manner that some of the light is reflected from an interface associated with the first layer, an interface associated with the second layer, or the translucent transflective layer, thereby forming the resonance phenomenon, and the almost remainder of the light transmits through the second layer made of the material having the light transmitting property, when viewed from the vicinity of the transflective structure layer.

With such a configuration, since the resonance phenomenon is further enhanced, the above-described effect of improving the color purity can be achieved more effectively. In addition, the problem with image deterioration such as deterioration in image brightness is considerably reduced.

In the light emitting device according to this aspect of the invention, a plurality of the light emitting elements are provided and the plurality of light emitting elements each correspond to a peculiar light emission color. The thickness of the second layer may be set so that a half width of a spectrum of light transmitting through the translucent transflective layer and having the light emission color is narrowed.

With such a configuration, numbers can be given to the N number (where N is a positive integer) of light emitting elements in order in accordance with an appropriate method. For example, 1, 4, 7, . . . , (N–2)-th light emitting elements can be configured to emit a red color, 2, 5, 8, . . . , (N–1)-th light emitting elements can be configured to emit a green color, and 3, 6, 9, . . . , N-th light emitting elements can be configured to emit a blue color (which is a specific example of "the light emitting elements each correspond to peculiar light emission color").

With such a configuration, the thickness of the second layer is set so that the half width of the spectrum of the light transmitted through the translucent transflective layer is narrowed. For example, in the above-mentioned example, since the light emitted from the 2, 5, 8, . . . , (N–1)-th light emitting elements is a green color, the peak corresponding to "the green color" can be observed in the spectrum. That is, the thickness of the second layer can be configured so that the half width of the peak is narrowed. The reason why the thickness of the second layer has an influence on the size of the half width is that light further transmitted through the translucent transflective layer or light traveling by an optical distance defined by the corresponding thickness is refracted and reflected from an interface between the translucent transflective layer and the second layer and an interface of the second layer opposite the interface.

with such a configuration, when the thickness of the second layer is appropriately set in conformity with the above condition, the purity of the light emission color is further improved. In addition, description associated with this configuration will be made below in the embodiment.

The light emitting device according to this aspect of the invention may further include a passivation layer which is disposed opposite the reflection layer with the translucent transflective layer interposed therebetween and prevents one of water and oxygen from entering the light emitting element. The thickness of the passivation layer may be set so that the half width is narrowed.

With such a configuration, since the passivation layer is provided, the life time can be improved. That is because water, oxygen, or the like does not enter the light emitting element.

With such a configuration, in addition to the second layer, the thickness of the passivation layer is set so that the half width of the spectrum of the light is narrowed. Therefore, the improvement in the purity of the above-described light emission color is more apparent. In addition, the reason why the thickness of the passivation layer has an influence on the size of the half width is the same as that in the second layer described above.

According to another aspect of the invention, there is provided a light emitting device including: a light emitting element which includes a first electrode layer, a second electrode layer, and a light emitting function layer disposed between the first electrode and the second electrode; a reflection layer which reflects light emitted from the light emitting function layer toward the light emitting function layer; and a translucent transflective layer which is disposed opposite the reflection layer with the light emitting function layer interposed therebetween to reflect some of the light emitted from the light emitting function layer toward the light emitting function layer and to transmit the remainder of the light. The translucent transflective layer is centered between a high refractive index layer having a refractive index n3 and being disposed on a side of the reflection layer and an inert gas having a refractive index n4 (where n4<n3) and being disposed opposite the high refractive index layer.

With such a configuration, an effect which is not substantially different from that in the light emitting device according to the above aspect of the invention is achieved according to this aspect of the invention.

The difference between the light emitting device according to the above-described aspect of the invention and the light emitting device according this aspect of the invention is that "the high refractive index layer" and "the inert gas" are provided instead of "the first layer" and "the second layer". In addition, the relation of n3>n4 is satisfied between the refractive index n3 of "the high refractive index layer" and the refractive index n4 of "the inert gas", like the relation of n1>n2.

With such a configuration, there is the high possibility of increasing the absolute amount of light associated with a resonation phenomenon. Accordingly, according to this aspect of the invention, the effect of improving the color purity is achieved.

For example, when the light emitting device is sealed in a can, "the inert gas" in this aspect of the invention includes a nitrogen gas or the like sealed in the can. When the gas sealed in the can is used as "the inert gas", a process of sealing a specific gas for the inert gas is not necessary in the arrangement of "the inert gas". Accordingly, the efficiency and simplification of the device configuration are designed and the manufacture easiness is improved.

As described above, the above-described aspects of the invention are not substantially different. Accordingly, the appended claims of the invention can belong to the aspects of the invention, as long as the claims are not contrary to the properties of the aspects of the invention.

According to still another aspect of the invention, there is provided an electronic apparatus including the light emitting devices having the above-described configuration.

With such a configuration, the light emitting devices described above are included. Accordingly, the effect of increasing the color purity is achieved, thereby displaying a higher quality image.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
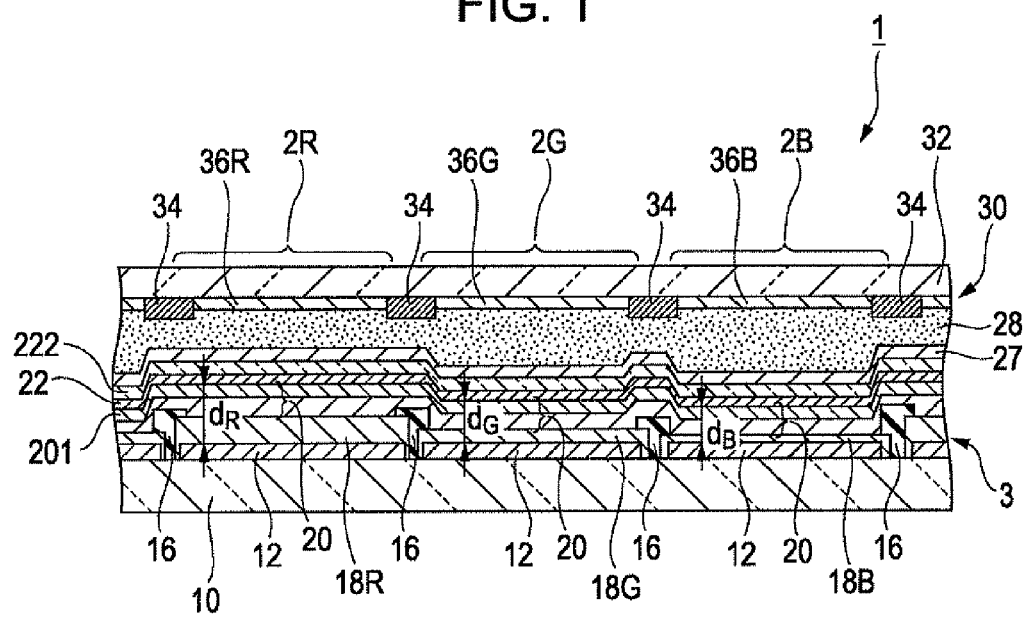
FIG. 1 is a schematic sectional view illustrating a light emitting device according to an embodiment of the invention.

Hereinafter, an embodiment of the invention will be described with reference to the drawings. In the drawings, elements are expressed in different scales from those of actual element.

Cross Section Structure of Organic EL Device

FIG. 1 is a schematic sectional view illustrating an organic EL device (light emitting device) 1 according to this embodiment of the invention. The organic EL device 1 includes a light emitting panel 3 and a color filter panel 30.

The light emitting panel 3 includes a plurality of light emitting elements (pixels) 2 (2R, 2G, and 2B), as shown in the drawing. According to this embodiment, the organic EL device 1 is used as a full-color image display device. The light emitting element 2R is a red light emitting element which emits red emission light, the light emitting element 2G is a green light emitting element which emits green emission light, and the light emitting element 2B is a blue light emitting element which emits blue emission light.

The light emitting elements 2 are connected to feeding TFTs (Thin Film Transistors), wirings, and the like. The TFTs, the wirings, and the like are formed on a substrate 10 so as to be interposed in an interlayer insulating film, for example.

In FIG. 1, the TFTs, the wirings, and the like are not illustrated in order to view the drawings with ease (where the interlayer insulating film can be formed between a reflection layer 12 and a first electrode layer 18 described below, or between the reflection layer 12 and the substrate 10, for example, and the interlayer insulating film is not also illustrated). Even though just the three light emitting elements 2 are shown in FIG. 1, light emitting elements more than the illustrated light emitting elements are actually provided. Hereinafter, subscript R, G, and B of the constituent elements correspond to the light emitting elements 2R, 2G, and 2B, respectively.

The illustrated light emitting panel 3 is of a top emission type. The light emitting panel 3 includes the substrate 10. The substrate 10 may be made of a transparent material such as glass or may be made of an opaque material such as ceramic or metal.

The reflection layer 12 having a uniform thickness is formed at a position overlapping with the light emitting elements 2 on the substrate 10. Since the reflection layer 12 is made of a material such as Al (Aluminum) or Ag (silver) having a high reflection ratio, the reflection layer 12 reflects light (including light emitted from the light emitting elements 2) traveling from the light emitting elements 2 upward of FIG. 1.

In the reflection layer 12, Cu, Zn, Nd, Pd, and the like may be added in addition to Al and Ag. Accordingly, it is expected that a heat-resisting property or the like is improved.

Separators 16 for partitioning the light emitting elements 2 are formed on the substrate 10. The separators 16 are made of an insulating resin material such as acrylic, epoxy, or polyimide.

Each of the light emitting elements 2 includes a first electrode layer 18, a second electrode layer 22, and a light emitting function layer 20 interposed between the first electrode layer 18 and the second electrode layer 22.

In this embodiment, each of the first electrode layers 18 (18R, 18G, and 18B) is a pixel electrode disposed in each of the pixels (light emitting elements 2), and is an anode, for example. The first electrode layers 18 are made of a transparent material such as ITO (Indium Tin Oxide) or $ZnO_2$. The thicknesses of the first electrode layers 18 are different from each other depending on a light emission color. That is, the thicknesses the first electrode layers 18R, 18G, and 18B are different from each other, which is described in more detail in Section of Light Reflection and Transmission Models.

In this embodiment, the light emitting function layer 20 is formed commonly in the plurality of light emitting elements 2 and has a uniform thickness, irrespective of the light emission colors of the light emitting elements 2. The light emitting function layer 20 has at least an organic light emitting layer. The organic light emitting layer emits white light when current flows. That is, the organic light emitting layer emits light having an optic component of a red color, a green color, and a blue color. The organic light emitting layer may have a single layer structure or may have a multi-layer structure (for example, a blue light emitting layer which emits blue light when current flows and a yellow light emitting layer which emits yellow light including red light and green light when current flows).

Even though not shown, the light emitting function layer 20 may include a hole transport layer, a hole injection layer, an electron block layer, a hole block layer, an electron transport layer, an electron injection layer, and the like in addition to the organic light emitting layer. Actually, the light emitting function layer 20 includes an electron transport layer (first layer) 201, which is illustrated in FIG. 1. The electron transport layer 201 is made of aluminum quinolinol complex (Alq3), for example. The electron transport layer 201 will be described below, when "a low refractive index layer 222" is described.

The second electrode layer (translucent transflective layer) 22 is made of a translucent transflective alloy such as MgAl, MgCu, MgAu, or MgAg or a metal material. In this embodiment, the second electrode layer 22 is a common electrode disposed commonly in the plurality of pixels (light emitting elements) and is a cathode, for example. The second electrode layer 22 has a uniform thickness, irrespective of the light emission colors of the light emitting elements 2. More specifically, the thickness of the second electrode layer 22 is in the range of about 5 to 20 [nm], for example. The second electrode layer 22 transmits some of light (including light emitted from the light emitting function layer 20) traveling from the light emitting function layer 20 upward of the drawing and reflects the remainder of the light downward of the drawing, that is, toward the first electrode layers 18.

The light emitting function layer 20 comes in contact with each of the first electrode layers 18 in an inside of openings (pixel openings) formed between the plurality of separators 16. Accordingly, when current flows between the first electrode layer 18 and the second electrode layer 22 in a light emitting element 2, holes are supplied from the first electrode layers 18 to the light emitting function layer 20 in the light emitting element 2 and electrons are supplied from the second electrode layer 22. At this time, when the holes and the electrons are recombined, exciters are generated. When the exciters are changed into a base state, energy is released, that is, a light emission phenomenon occurs. Accordingly, a light emission area of the light emitting element 2 is mainly demarcated to the pixel opening formed between the separators 16. That is, the pixel opening of the separator 16 divides the light emitting elements 2.

The light emitting function layer 20 emits white light. However, since light reciprocates between the reflection layer 12 and the second electrode layer 22, the light emitting elements 2 each emit light having an amplified specific wavelength. That is, the light emitting element 2R emits light having an amplified red wavelength, the light emitting element 2G emits light having an amplified green wavelength, and the light emitting element 23 emits light having an amplified blue wavelength. Accordingly, in the light emitting elements 2R, 2G, and 2B, optical distances d ($d_R$, $d_G$, and $d_B$) between the reflection layer 12 and the second electrode layer 22 are different from each other. In the drawing, d ($d_R$, $d_G$, and $d_B$) denote an optical distance and do not represent an actual distance, which will be described in more detail in Section of Light Reflection and Transmission Models.

The low refractive index layer (second layer) 222 is formed on the upper middle portion of the second electrode layer 22 in FIG. 1.

The lower refractive index layer 222 is made of a material having a light transmission property. An example of the material having the light transmission property is fluoride such as LiF and CaF2. Alternatively, the lower refractive index layer 222 may be made of a resin material such as polytetrafluoroethylene. Even in this case, the lower refractive index layer 222 can be said to be "made of the material having the light transmission property" in the invention.

The thickness of the lower refractive index layer 222 is preferably in the range of 20 to 70 nm, for example.

The lower refractive index layer 222 has a refractive index smaller than a refractive index of the electron transport layer 201 descried above. That is, assuming that the refractive index of the lower refractive index layer 222 is $n_U$ and the refractive index of the electron transport layer 201 is $n_D$, a relation of $n_U < n_D$ is satisfied. More specifically, when the lower refractive index layer 222 is made of LiF, as described above, the refractive index is mainly in the range of 1.4 to 1.5. When the lower refractive index layer 222 is made of polytetrafluoroethylene, the refractive index is 1.29. On the other hand, when the electron transport layer 201 is made of Alq3, the refractive index is mainly about 1.8. Therefore, the relation of $n_U < n_D$ is satisfied.

Alternatively, the electron transport layer 201 may be made of quinolinol lithium (Liq), for example, in addition to Alq3. Here, a refractive index of quinolinol lithium is 1.75. In this case, the electron transport layer also functions as an electron injection layer.

On the other hand, the electron injection layer may be formed of a material different from the material for forming the electron transport layer. For example, when the electron transport layer 201 is made of Alq3 or the like, as described, the corresponding electron injection layer can be made of LiF. In this case, when viewed from an upper side in FIG. 1, a three-layered structure of the second electrode layer 22, the electron injection layer, and the electron transport layer 201 is formed.

At this time, the corresponding electron injection layer is sometimes formed to be very thin (specifically, 3 or less nm and more specifically the range of about 0.5 to 1 nm). In the case, an influence of the corresponding electron injection layer on light transmitted through the electron injection layer or light reflected from the interface of the corresponding electron injection layer can be almost ignored. Here, a layer suitable for "the first layer" in the invention is the electron transport layer 201. That is, a comparable refractive layer with the refractive index $n_U$ of the lower refractive index layer 222 is not the refractive index of the very thin electron injection layer but the refractive index $n_D$ of the electron transport layer 201.

In brief, "the first layer" and "the second layer" in the invention are constituent elements between which "the translucent transflective layer" is centered. However, other constituent elements having no layer may be interposed between "the first layer" and "the translucent transflective layer" or between "the second layer" and "the translucent transflective layer", depending on a case (where it goes without saying that the phrase "the translucent transflective layer is "centered"" does not mean geometric "center"). Since "the first layer" or "the second layer" is characterized in that one layer is formed on the basis of the comparison of the refractive indexes (n1 and n2) thereof, a physical arrangement configuration is not basically limited.

A passivation layer 27 is formed on the upper surface of the low refractive index layer 222 in FIG. 1. The passivation layer 27 is formed of an inorganic material having a barrier property of transparent gas such as SiON. Accordingly, since the passivation layer 27 is made of an inorganic transparent material such as SiON, the passivation layer 27 particularly prevents deterioration of the light emitting function layer 20 of the light emitting elements 2 which is caused due to moisture or oxygen. In this way, the light emitting panel 3 is formed.

A color filter panel 30 are adhered to the light emitting panel 3 by a transparent adhesive 28. The color filter panel 30 includes a substrate 32 made of a transparent material such as glass, black matrixes 34 formed on the substrate 32, and color filters 36 (36R, 36G, and 36B) disposed in openings formed in the black matrixes 34.

The adhesive 28 is disposed between the color filters 36 of the color filter panel 30 and the passivation layer 27 (see FIG. 2) of the light emitting panel 3 and supports the substrate 32 of the color filter panel 30 and the color filters 36 in parallel respective to the layers of the light emitting panel 3.

The color filters 36 are each disposed at a position overlapping with the light emitting elements 2 and particularly with the first electrode layers 18. The color filters 36, which are disposed opposite the light emitting function layer 20 with the second electrode layer 22 having a translucent transflective property interposed therebetween, transmit the light which has been transmitted through the second electrode layer 22 of the light emitting elements 2 overlapping with the color filters 36.

Hereinafter, more details will be described.

Since the color filter 36R overlaps with the light emitting element 2R, one color filter 36R and one light emitting element 2R form a set. The color filter 36R has a function of transmitting red light and a peak wavelength of its transmissivity is 610 nm. The color filter 36R transmits the amplified red light which has been transmitted through the second electrode layer 22 of the light emitting element 2R overlapping with the color filter 36R to improve the purity of red light. In addition, the color filter 36R absorbs most of green and blue light.

Since the color filter 36G overlaps with the light emitting element 2G, one color filter 36G and one light emitting element 2G form a set. The color filter 36G has a function of transmitting green light and a peak wavelength of its transmissivity is 550 nm. The color filter 36G transmits the amplified green light which has been transmitted through the second electrode layer 22 of the light emitting element 2G overlapping with the color filter 36G to improve the purity of green light. In addition, the color filter 36G absorbs most of red and blue light.

Since the color filter 36B overlaps with the light emitting element 2B, one color filter 36B and one light emitting element 2B form a set. The color filter 36B has a function of transmitting blue light and a peak wavelength of its transmissivity is 470 nm. Since the color filter 36B overlaps with the light emitting element 2B, the color filter 36B transmits the amplified blue light which has been transmitted through the second electrode layer 22 of the light emitting element 2B, thereby improving the purity of blue light. In addition, the color filter 36B absorbs most of red and green light.

Light Reflection and Transmission Models

Figure 2:
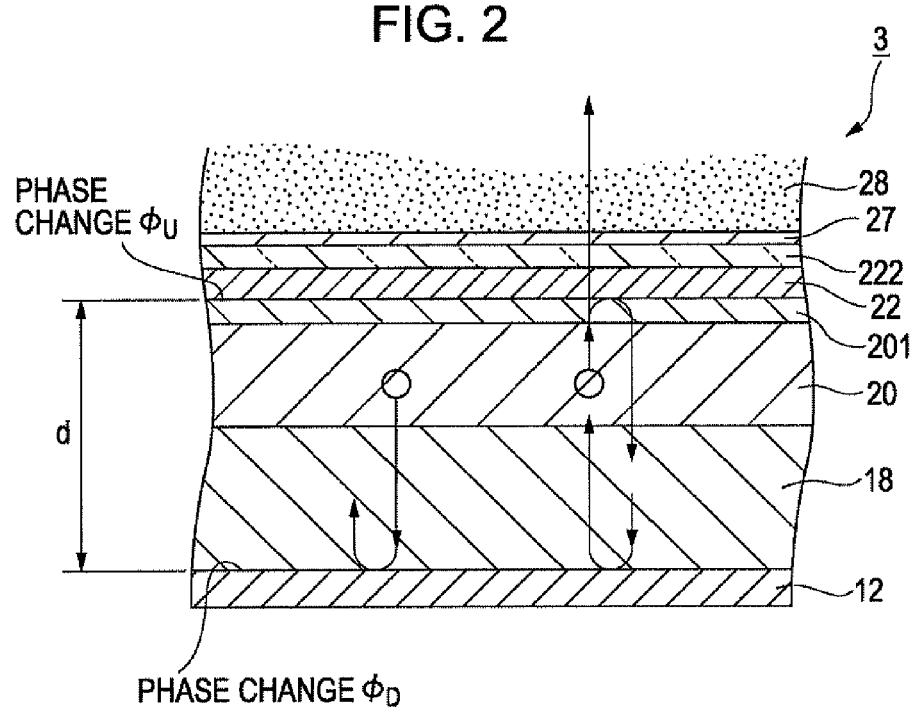
FIG. 2 is a schematic diagram illustrating a light locus inside a resonator structure of the light emitting device in FIG. 1.

FIG. 2 is a schematic diagram illustrating a light locus emitted from the light emitting function layer 20. As shown on the left side of the drawing, some of the light emitted from the light emitting function layer 20 travels toward the first electrode layer 18 and is reflected from the light emitting function layer 20 of the reflection layer 12. A phase change at the time of this reflection is denoted by $\phi_D$. On the other hand, the remainder of the light travels toward the second electrode layer 22, as shown on the right side in the drawing, and the remainder of the light is reflected from the surface (the interface of the second electrode 22 opposed to the reflection layer 12) of the second electrode layer 22 on the side of the light emitting function layer 20. A phase change at the time of this reflection is denoted by $\phi_u$.

In the latter case, that is, in the case where the light is reflected from the second electrode layer 22, the light transmits through the light emitting function layer 20 and the first electrode layer 18 after the reflection, and then is reflected again from the surface of the reflection layer 12 on the side of the light emitting function layer 18, as shown in FIG. 2. In this way, the reflection of the light between the second electrode layer 22 and the reflection layer 12 is infinitely repeated in principle and ideally. In the former case, that is, in the case where the light is reflected from the reflection layer 12, the same is applied, even though not shown.

A change in a light path formed by refraction of light from each interface is not shown in FIG. 2 and the light path is shown by a simple straight line or a simple curved line.

On the assumption that this reflection phenomenon occurs, in this embodiment, an optical distance d shown in FIG. 2 (or FIG. 1) is determined by Expression (1) as follows:

$$2d + \phi_D + \phi_U = m\lambda \quad (1),$$

where $\lambda$ is a wavelength [nm] set as a resonance target and m is an integer. In a, $\phi_D$ and $\phi_U$ are the phase change, as described above.

In this embodiment, $\lambda$ or d is determined in each of the light emitting elements 2R, 2G, and 2B, as apparent in FIG. 1. More specifically, since the light emitting elements 2R, 2G, and 2B and the color filters 36R, 36G, and 36B form the sets, respectively, as described above, each of wavelengths (that is, $\lambda_R$=610 nm, $\lambda_G$=550 nm, and $\lambda_B$=470 nm, as described above) corresponding to peaks of the transmissivities of the color filters 36R, 36G, and 36B can be set as (or substituted by) the wavelength $\lambda$, respectively. In addition, $d_R$, $d_G$, and $d_B$ (see FIG. 1) respectively corresponding to $\lambda_R$, $\lambda_G$, and $\lambda_B$ are obtained as the optical distance d. In addition, when roots of $d_R$, $d_G$, and $d_B$ are calculated, values ($\phi_D = \phi_{DR}$, $\phi_{DG}$, $\phi_{DB}$ or $\phi_U = \phi_{UR}$, $\phi_{UG}$, $\phi_{UB}$) corresponding to $\lambda_R$, $\lambda_G$, and $\lambda_B$ are used as $\phi_D$ and $\phi_U$, respectively, in Expression (1).

In order to realize $d_R$, $d_G$, and $d_B$ calculated by Expression (1) in an actual apparatus, the thicknesses of the first electrode layers 18 (18R, 18G, and 18B) are adjusted for the light emitting elements 2 (2R, 2G, and 2B) in this embodiment, as shown in FIG. 1.

In general, "an optical distance" of an object is expressed by a product of the physical thickness of the object and the refractive index of the object. Therefore, assuming that the physical thickness of the first electrode layer 18 is t and the refractive index of the first electrode layer 18 is $n_{18}$, the entire optical distance D of the corresponding first electrode layer 18 and the light emitting function layer 20 is as follows:

$$D = t \cdot n_{18} + D_{20} \qquad (2)$$

Where $D_{20}$ is an optical distance for the light emitting function layer 20.

In Expression (2), since the refractive index $n_{18}$ is not variable, it is necessary to vary t in order to satisfy one of D=$d_R$, D=$d_G$, and D=$d_B$. In this way, $t_R$ in the case of D=$d_R$, $t_G$ in the case of D=$d_G$, and $t_B$ in the case of D=$d_B$ can be obtained. The thickness of the first electrode layer 18 is adjusted on the basis of the result. In addition, when the roots of $t_R$, $t_G$, and $t_B$ are calculated, values ($n_{18}$=$n_{18R}$, $n_{18G}$, $n_{18B}$) corresponding to $\lambda_R$, $\lambda_G$, and $\lambda_B$ are used for $n_{18}$ in Expression (2).

With such a configuration, the light emitting function layer 20, the reflection layer 12, and the second electrode layer 22 form an optical resonator in this embodiment. That is, the light emitted from the light emitting function layer 20 is repeatedly reflected between the reflection layer 12 and the second electrode 22. At this time, only light having a specific wavelength component is affected by amplified interference or a resonant phenomenon is involved.

For example, since the optical distance $d_R$ is defined to be integral multiple of the wavelength $\lambda_R$ in the light emitting element 2R in Expression (1), the resonant phenomenon for the light having the wavelength λR occurs in the light emitting element 2R. In addition, since the second electrode layer 22 has a transflective characteristic, some of the light (that is, red light) having the amplified wavelength $\lambda_R$ travels to the outside of the device (in the drawing, see an arrow extending upward beyond the second electrode layer 22). In consequence, a red color is intensified. In this case, the same is applied to a green color and a blue color.

Operational Advantage of Organic EL Device

Hereinafter, operational advantages of the organic EL device 1 having the above-described configuration will be described with reference to FIGS. 3 to 5 in addition to FIGS. 1 and 2.

Figures 3, 4:
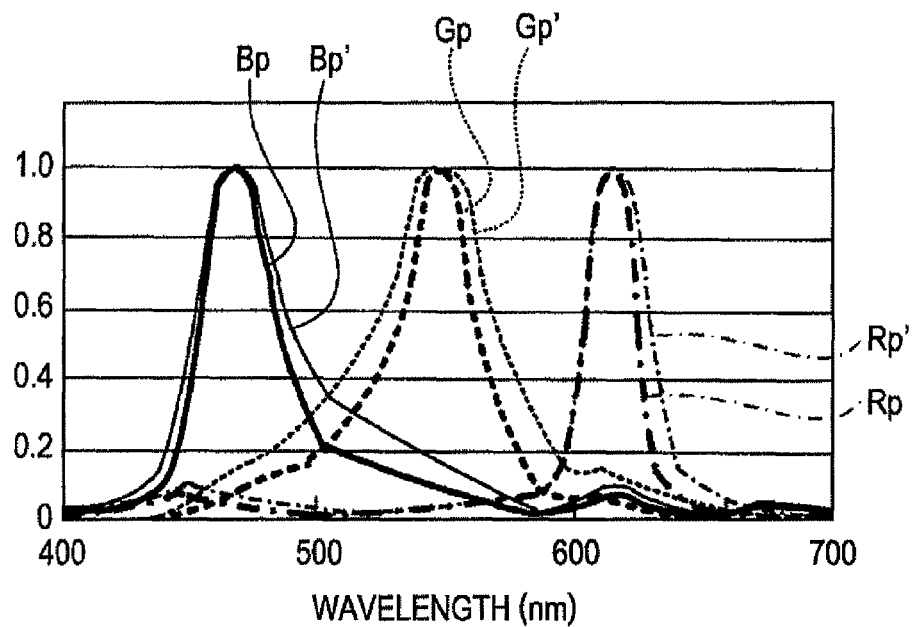
FIG. 3 is a diagram illustrating a simulation result of a spectrum of light emitted from the light emitting device in FIG. 1.
FIG. 4 is a diagram illustrating a decrease degree of a half width observed in FIG. 3 as detailed numerical values.

FIGS. 3 and 4 show a result obtained by carrying out an optical simulation by use of the organic EL device 1 having the above-described configuration. The simulation result can be obtained using an optical simulation program, which is "OptDesigner", a product name, made by Toyota Central R&D Labs., Inc.

This simulation makes the following assumptions. That is, (i) the reflection layer 12 is made of APC. The thickness thereof is 80 [nm]. APC is an alloy composed of Ag, Pd, and Cu (where Pd of 0.9% by weight, Cu of 1% by weight, and Ag of the remainder by weight). (ii) The first electrode layers 18 are made of ITO. The thickness of the first electrode layer 18R corresponding to the red color is 80 [nm], the thickness of the first electrode 18G corresponding to the green color is 70 [nm], and the first electrode layer 18B corresponding to the blue color is 27 [nm]. (iii) The total thickness of the light emitting function layer 20 is 131 [nm]. In the total thickness thereof, the thickness of the electron transport layer 201 is 10 [nm] and the thickness of the electron injection layer is 1 [nm]. In addition, the electron transport layer 201 is made of Alq3 and the electron injection layer is made of LiF. (iv) The second electrode layer 22 is made of MgAg (10:1) and the thickness thereof is 10 [nm]. (v) The low refractive index layer 222 is made of LiF and the thickness thereof is 45 [nm]. (vi) The passivation layer 27 is made of SiON and the thickness thereof is 225 [nm].

Under these assumptions, a result obtained by calculating a spectrum of the light emitted from each of the light emitting elements 2 to the outside is shown in FIG. 3. In FIG. 3, a solid line represents a blue color, a dashed line represents a green color, and a one-chain line represents a red color. In addition, a heavy line shows the result obtained under the above-described assumptions and a thin line shows a result obtained from a comparative example. Here, in the comparative example, the result is obtained in the same calculation manner when the low refractive index layer 222 according to this embodiment is not present (see the above-described (v)) and thickness of the passivation layer 27 is 220 [nm] (see the above-described (vi) and see (3) described below in modified examples). In the drawing, Bp denotes a blue curve, Bp' denotes a blue curve of the comparative example, Gp denotes a green curve, Gp' denotes a green curve of the comparative example, Rp denotes a red curve, and Rp' denotes a red curve of the comparative example.

As shown in FIG. 3, the curves are standardized so that the top point of each peak is 1.

In FIG. 3, it can be known that an effect of improving color purity is achieved to some extent in all curves. As described above, the organic EL device 1 according to this embodiment has the resonator structure formed by the reflection layer 12, the first electrode layer 18, the light emitting function layer 20, and the second electrode layer 22. The resonator structure is assumed to satisfy Expression (1) described above.

In FIG. 3, sharpness of the peak increases in each of the curves, as indicated by changes in the thin line and the heavy line in the red, green, and blue curves. That is, the half width decreases. Actually, as shown in FIG. 4, decrease amounts of the half widths of the blue, green, and red curves are calculated as 3 [nm], 16 [nm], and 3 [nm], respectively. From FIGS. 3 and 4, it can be known that a change for the green color, that is, the change from the green curve Gp' of the comparative example to the green curve Gp of this embodiment is relatively larger.

This change means that the color purity of each light emitting color is further improved. In general, a red color becomes a deeper red or a blue color becomes a deeper blue. In addition, it is apparent that this change associates with the presence of "the low refractive index layer 222" in consideration of a difference between this embodiment and the comparative example.

The reason for obtaining this result is as follows. That is, in FIG. 1, under the assumption of a layer (hereinafter, simply referred to as "structure layers 201 to 222") integrally including three layers, that is, the electron transport layer 201, the second electrode layer 22, the low refractive index layer 222, the light incident on the structure layers 201 to 222 from the inside of the resonator structure is reflected from the corresponding structure layers 201 to 222 under a total reflection condition or a condition close to the total reflection condition.

Figure 5:
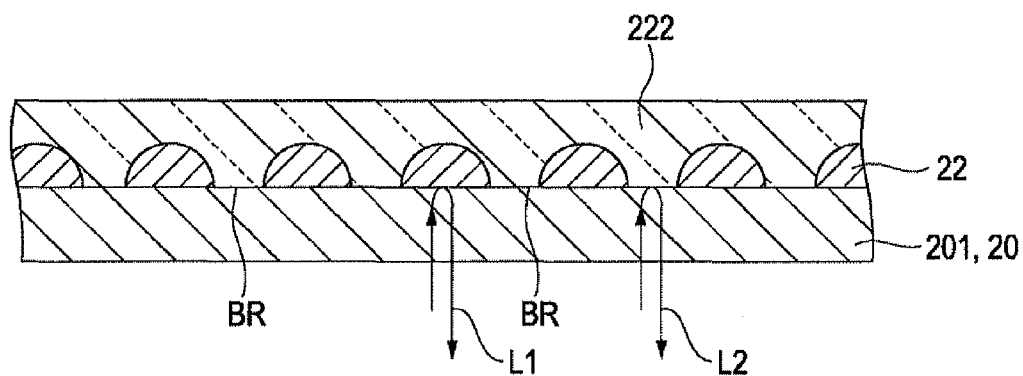
FIG. 5 is a diagram schematically illustrating the structure of layers when the thickness of a second electrode layer is relatively thin in the light emitting device in FIG. 1.

Here, "the reflection from the structure layers 201 to 222", implies that the light is reflected from an interface between the electron transport layer 201 and the low refractive index layer 222, as shown in FIG. 5. Even in this case, when the thickness of the second electrode layer 22 is too thin (particular, 10 or less [nm]), the second electrode layer 22 does not cover the entire surface of the electron transport layer 201 or the light emitting function layer 20, but is formed in an island shape, in many cases, as shown in FIG. 5. The above-described interface between "the electron transport layer 201 and the low refractive index layer 222" is indicated by BR in FIG. 5.

In view of the above description, there is a high possibility of increasing an absolute amount of light associated with the resonance phenomenon. That is because light L1 is expected to be reflected with high efficiency from the interface between the second electrode layer 22 and the light emitting function layer 20 and light L2 is expected to be reflected with high efficiency from the above-described interface BR. However, in the comparative example, since the low refractive index layer 222 is not present, this advantage cannot be expected or obtained in some cases. Accordingly, according to the invention, the effect of improving the color purity can be achieved.

The configuration in which "the first layer" and "the second layer" (particularly, "the second layer") according to the invention "directly contact with the second electrode layer 22 as "the translucent transflective layer" can contribute to the reason for achieving this advantage (see FIG. 5). That is because there is a possibility of forming the interface (that is, the interface between "the electron transport layer 201" and "the low refractive index layer 222" described above according to this embodiment) between "the first layer" and "the second layer" under this condition.

As described above, the following advantages can be obtained in addition to the effect of improving the color purity.

[I] First, in this embodiment, image deterioration such as deterioration in image brightness is not caused, even when the above-described effect of improving the color purity is obtained. That is because most of the light transmitting through the second electrode layer 22 is not attenuated, since the thickness of the second electrode layer 22 is very thin in this embodiment. In this embodiment, since the above-described low refractive index layer 222 is made of the material having the light transmitting property, most of the light is not absorbed or attenuated even at the time of transmitting through the low refractive index layer 222. In consequence, according to this embodiment, it is possible to obtain a very bright image.

The fact that the appropriate thickness of the second electrode layer 22 is limited to the range of 5 to 20 [nm] is a result obtained thanks to the advantage described just above and the various reasons described above.

That is, the lower limit value of 5 [nm] has a meaning of a value close to a limit value for forming a film in most cases and also has a meaning of avoiding a problem that the reflection (see Fig. the light L1 in FIG. 5) from the interface of the second electrode layer 22, which is originally intended, is not expected. A decrease in the amount of light associated with the resonance phenomenon may be caused in the thickness of 5 or less [nm], thereby deteriorating the color purity.

On the other hand, the upper limit value of 20 [nm] is set mainly in accordance with the increase and decrease in the amount of transmitted light (in this case, the reflection effect in the interface BR described above in FIG. 5 is not ignored). That is, when the thickness is larger than the upper limit value, light attenuation in the second electrode layer 22 is increased, thereby deteriorating the image brightness.

An appropriate range of the thickness of the second electrode layer 22 is set so as to satisfy the effect of increasing the color purity on the basis of the resonance phenomenon and the effect of increasing the amount of transmitted light, which are contrary to each.

[II] in this embodiment, the electron transport layer 201 corresponds to "the first layer" according to the invention and the second electrode layer 22 corresponds to "the translucent transflective layer" according to the invention. Accordingly, efficiency and simplification of the device configuration are designed and the manufacture easiness is improved. In other words, in this embodiment, there is no problem that complication of the device configuration and manufacture difficulty may be caused when "the first layer" or "the translucent transflective layer" are made of different materials.

The invention is not limited to the light emitting device described above in the embodiment, but may be modified in various forms.

(1) First, in the above-described embodiment, the light emitting function layer 20 emits the white light. However, the invention is not limited thereto.

Figure 6:
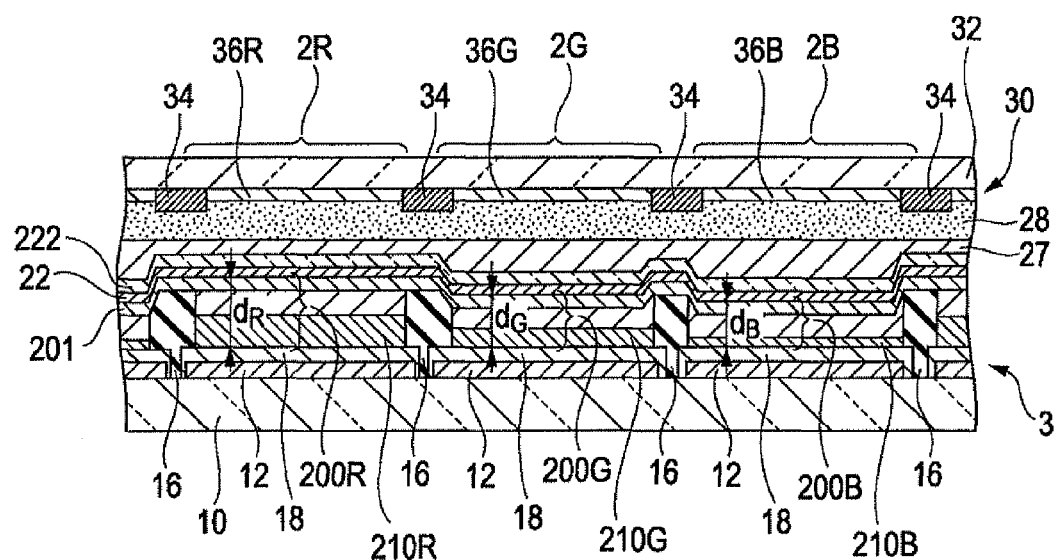
FIG. 6 is a sectional view illustrating a light emitting device according to a modified example (1) of the invention.

For example, as shown in FIG. 6, as for light emitting function layers 200, light emitting function layers 200R, 200G, and 200B may be provided in the light emitting elements 2R, 2G, and 2B, respectively, in the same manner in which the first electrode layers 18R, 18G, and 18B according to the above-described embodiment are formed in correspondence with the color filters 36R, 36G, and 36B. Each of the light emitting function layers 200R, 200G, and 200B is disposed inside the pixel opening of the separator 16. The light emitting function layer 200R emits a red color, the light emitting function layer 200G emits a green color, and the light emitting function layer 200B emits a blue color. In order to realize the light emission, an organic EL material included in each of the light emitting function layers 200R, 200G and 200B may be appropriately modified. In order to actually manufacture this configuration, an ink jet method (liquid droplet ejecting method) or the like can be used.

In the above-described embodiment, in order to satisfy Expression (1) described above, the thicknesses of the first electrode layers 18 are each adjusted. However, in the configuration in FIG. 6, by adjusting the thickness of a hole transport layer 210 forming a part of the light emitting function layer 200, the resonator structure satisfying Expression (1) described above is realized. That is, the hole transport layers 210 are formed by hole transport layers 210R, 210G, and 210B which have physically different thicknesses in the light emitting elements 2R, 2G, and 2B, respectively (in FIG. 6, the thicknesses of the first electrode layers 18 are the same one another, and thus the first electrode layers "18R", "18G", and "18B" are not distinguished from each other).

Even though the difference with the above-described embodiment is present, the basic spirit of the invention is the same as that in the above-described embodiment. Accordingly, this configuration is in the scope of the invention.

The importance viewpoint of the invention is that in this modified example, the second electrode layer 22 is centered between the electron transport layer 201 as "the first layer" and the low refractive index layer 222 as "the second layer", like the above-described embodiment.

Figures 7, 8:
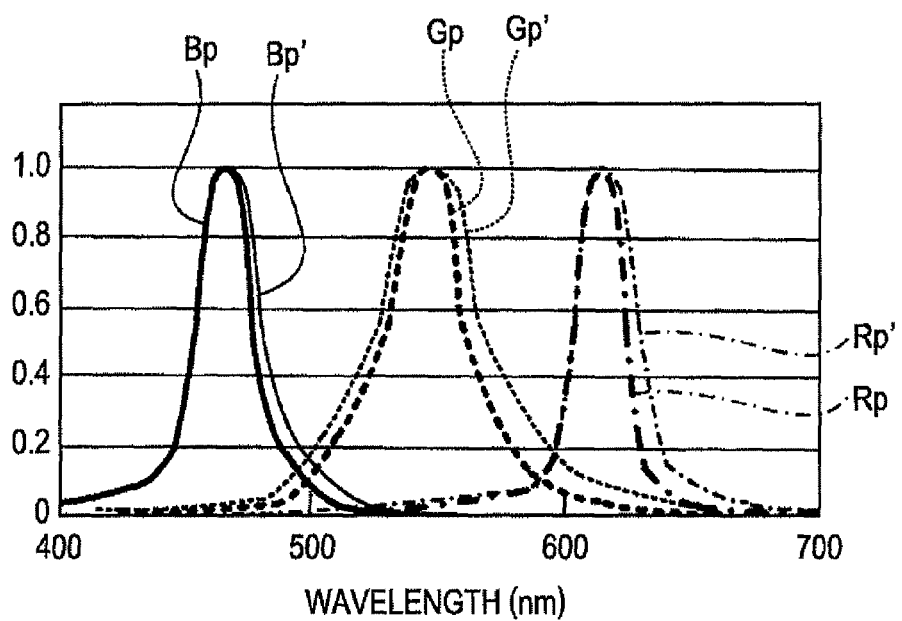
FIG. 7 is a diagram illustrating a simulation result of a spectrum of light emitted from the light emitting device in FIG. 6.
FIG. 8 is a diagram illustrating a decrease degree (a thin line→a heavy line) of a half width observed in FIG. 7 as detailed numerical values.

The operation advantages in the configuration shown in FIG. 6 are not substantially different from those in the above-described embodiment, as shown in FIGS. 7 and 8 (and FIGS. 7 and 8 show a result obtained by executing an optical simulation on the basis of the organic EL device shown in FIG. 6, but as apparent from the drawing, FIGS. 7 and 8 correspond to FIGS. 3 and 4 in the above-described embodiment. The assumptions in FIGS. 3 and 4 (for example, (iv), (v), (vi), and the like) are made also in FIGS. 7 and 8, as long as the features are satisfied).

In FIGS. 7 and 8, the effect of increasing the color purity shown in FIGS. 3 and 4 is more effectively achieved. That is, when FIG. 7 is compared to FIG. 3, in the former case, a bottom area spreading around the peak is very narrow and thus the shape becomes smarter. On the other hand, when FIG. 8 is compared to FIG. 4, a decrease value of the half width (excluding the half width of the blue color) is increased more in the former case than in the latter case.

It is considered that the reason is to provide the light emitting function layers 200 in the light emitting elements 2R, 2G, and 2B, respectively, according to the colors.

In this modified example, the above-described various advantages can be also obtained.

(2) In the above-described embodiment, "the second layer" according to the invention is provided, but the invention is not limited to this configuration.

Figure 9:
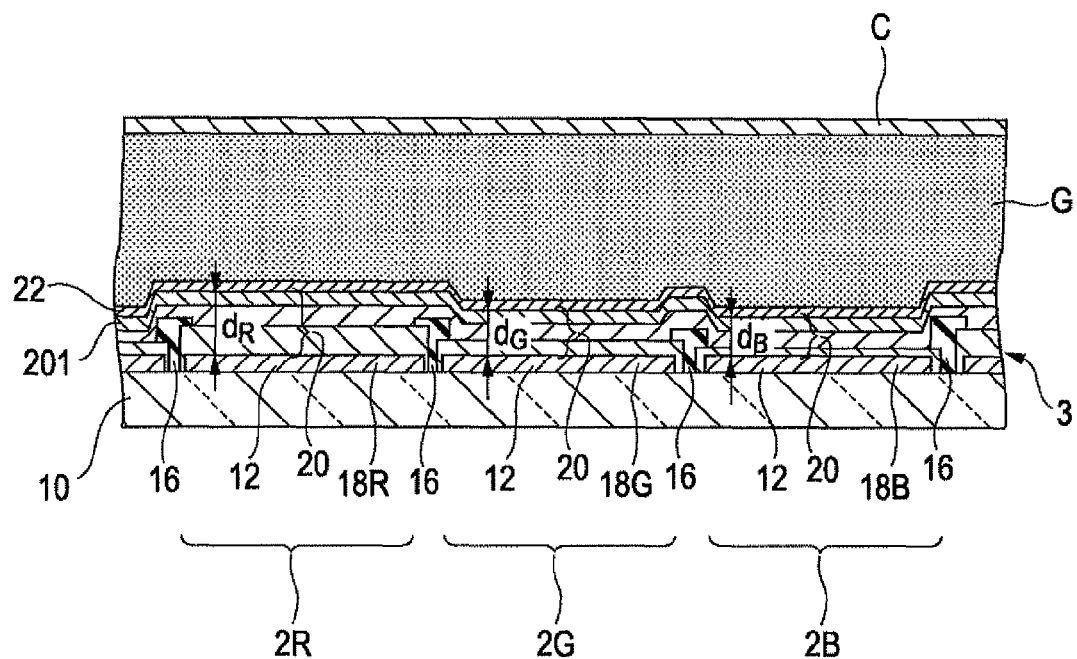
FIG. 9 is a sectional view illustrating a light emitting device according to a modified example (1) of the invention.
Figure 10:
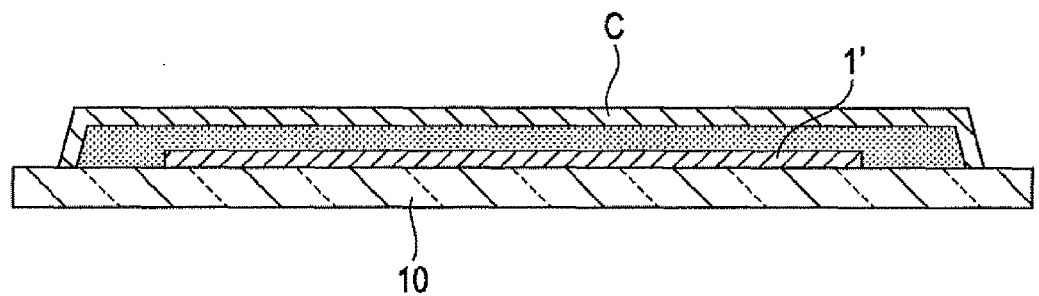
FIG. 10 is a sectional view illustrating the overall configuration of the light emitting device in FIG. 9.

For example, when the whole organic EL device 1' is sealed inside a space surrounded by separator C made of an appropriate material such as glass (a resin material or metal), as shown in FIGS. 9 and 10, an inert gas G sealed inside the space may serve as the low refractive index layer 222 according to the above-described embodiment. That is, the configuration of the layers positioned from the second electrode layer 22 to the lower middle layer is the same as that in the above-described embodiment. However, as shown in FIG. 9, the layers above the low refractive index 222 are not present and the inert gas G inside the separator C contacts with the supper surface of the second electrode layer 22 in the drawing. Examples of the inert gas G include an $N_2$ gas and an argon gas. A refractive index $n_G$ of the inert gas G satisfies a relation of $n_G < n_D$, when the refractive index $n_D$ of the above-described electron transport layer (high refractive index layer) 201 is used without change.

Even in the configuration shown in FIGS. 9 and 10, advantages which are not substantially different from the operation advantages obtained in the above-described embodiment can be obtained. That is, since there is a high possibility that the light incident from the reflection layer 12 is reflected from an interface between the inert gas G and the second electrode layer 22, an increase in the light associated with the resonance phenomenon can be expected.

(3) In the above-described embodiment, the simulation is executed under the assumptions (i) to (vi), but the invention is not limited thereto. Hereinafter, the thicknesses of the low refractive index layer 222 and the passivation layer 27 will be particularly described.

As described above, the organic EL device 1 according to the above-described embodiment has the resonator structure formed by the layers between the reflection layer 12 and the second electrode layer 22. In this configuration, it seams that the low refractive index layer 222 and the passivation layer 27 do not contribute to the resonance phenomenon or the effect of increasing the color purity, since the low refractive index layer 222 and the passivation layer 27 are positioned outside the resonance structure. In the actual device, however, the low refractive index layer 222 and the passivation layer 27 have at least a dominance relation of the finally achieved effect of increasing the color purity. For example, the light transmitting through the second electrode layer 22 toward the low refractive index layer 222 further travels by an optical distance determined by the thickness of the low refractive index layer 22 or is refracted and reflected from the interface between the second electrode layer 22 and the low refractive index layer 222 and the interface between the low refractive index layer 222 opposite the interface. In addition, the light traveling the various paths may interfere with the light coming out from the resonator structure. In this case, when the interference occurs, an undesired phenomenon such as attenuate interference may occur. Depending on a case, even when the half width is considerably decreased thanks to the resonator structure or the structure layers 201 to 222, the advantage may be reduced.

In view of this circumstance, it is preferable that the thickness of the low refractive index layer 222 or the passivation layer 27 is set so that the half width of the spectrum of the light having the light emitting colors corresponding to the light emitting elements 2R, 2G, and 23 is narrowed. The thickness thereof can be determined by use of an experimental estimation method, a simulation estimation method, or the like.

The assumptions (v) and (vi) (that is, the 45 [nm] thickness of the low refractive index layer 222 and the 225 [nm] thickness of the passivation layer 27) in the above-described embodiment have a meaning as appropriate values obtained by a simulation of trial and error in view of the circumstance.

The assumption condition of a specific example of the above-described embodiment is that the thickness of the passivation layer 27 is 225 [nm]. In addition, the assumption condition of the comparative example is that the thickness of the passivation layer 27 is 220 [nm]. These thicknesses have been set in order to reflect the above-mentioned circumstance. That is, in the comparative example, the low refractive index layer 222 is not present, as described above. In this case, the best thickness value set in order to improve the color purity is "220 [nm]" (above all, even when the best value is not achieved in the comparative example, the reason why the effect of increasing the color purity in the above-described above is better than that in the comparative example has been described).

As described above, the thickness of the low refractive index layer 222 may be different in each of the light emitting elements 2R, 2G, and 23 depending on a case. That is, when the low refractive index layer 222 is formed on an underlying flat surface, the low refractive index layer 222 has an uneven surface having a step at each location. The same is applied to the thickness of the passivation layer 27.

When the configuration is realized, a problem may occurs in that it is difficult to manufacture the whole organic EL device. Therefore, the thickness as "a so-called optimum value" may be set in consideration of the state or the like of the spectrum of each light emitting color instead of the above configuration. "The optimum value" is calculated in the following order, for example (and the order is just the simplest example).

(A) Under the assumption of the respective color curves Rp', Bp', and Gp', of the comparative example, it can be known that the green curve Gp' of the comparative example has the largest half width and thus has the so-called most rounded peak. Accordingly, as a first consideration method, a method of narrowing the half width of the peak of the green curve Gp' of the comparative example can be considered. (B) The intended thickness of the low refractive index layer 222 is calculated by a simulation or the like. (C) it is confirmed that the result of (B) has which influence on the blue curve Bp' of the comparative example and the red curve Rp' of the comparative example. (D) When the result of (C), that is, the change in the blue curve Bp' and red curve Rp' of the comparative example is in a predetermined change range, the previous result is determined as the intended thickness (that is, "the optimum value" for the whole colors). (E) Otherwise, the result of (B) is minutely adjusted so that the change is in the predetermined change range. (F) Subsequently, (D) and (E) are repeated.

Even when the thickness of the low refractive index layer 222 is determined in this manner, the sentence "the thickness of the second layer is set so that the half width of the spectrum of the light is narrowed" in the invention is realized. The above description is applied to the thickness or the determination method of the passivation layer 27.

(4) In the above-described embodiment, the organic EL device 1 is of the top emission type, but the organic EL device 1 according to the invention may be of a bottom emission type. In this case, referring to FIG. 1 or 2, "a translucent transflective layer" is positioned at the location of the reflection layer 12 and "a reflection electrode layer" is positioned at the location the second electrode layer 22.

In this case, when "the translucent transflective layer" is centered between "the first layer" and "the second layer" (or "the high refractive index layer and "the inert gas") according to the invention, it is apparent that operation advantages which are not substantially different from the operation advantages according to the above-described embodiment are obtained.

(5) In the above-described embodiment, the first transparent electrode layer 18 serves as an anode and the second electrode layer 22 having a translucent transflective property serves as a cathode. However, the first electrode layer 18 may serve as a cathode and the second electrode layer 22 may serve as an anode. In this case, of course, the arrangement relation of the electron transport layer 201, the hole transport layer 201, or the like forming the light emitting function layer 20 is changed.

(6) In the above-described embodiment, the first electrode layer 18 and the reflection layer 12 are separate layers, but the first electrode layer 18 may function as a reflection layer together.

(7) The light emitting device according to the above-described embodiment is an organic EL device, but the light emitting device according to the invention may be an inorganic EL device.

APPLIED EXAMPLES

Figure 11:
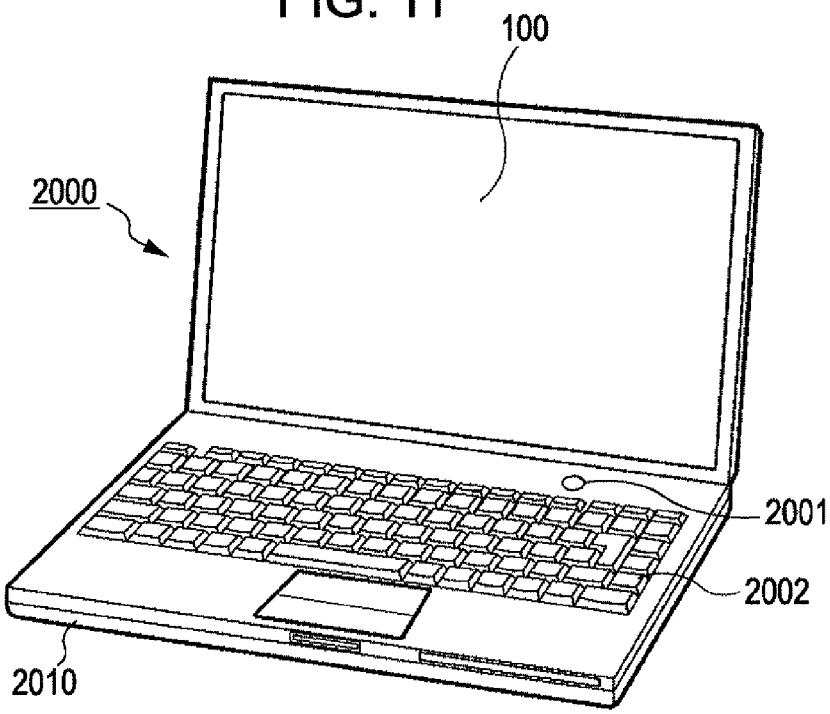
FIG. 11 is a perspective view illustrating an electronic apparatus to which the organic EL device related to the invention is applied.

Next, an electronic apparatus to which the organic EL device according to the invention is applied will be described. FIG. 11 is a perspective view illustrating a configuration of a mobile personal computer using the light emitting device according to this embodiment as an image display device. A personal computer 2000 includes an organic EL device 100 as a display device and a body unit 2010. The body unit 2010 includes a power supply switch 2001 and a keyboard 2002.

Figure 12:
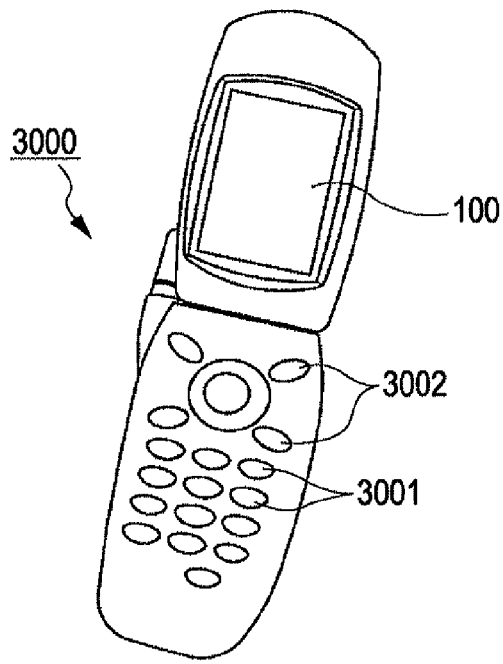
FIG. 12 is a perspective view illustrating another electronic apparatus to which the organic EL device related to the invention is applied.

FIG. 12 shows a cellular phone to which the light emitting device according to this embodiment is applied. A cellular phone 3000 includes a plurality of operation buttons 3001, scroll buttons 3002, and an organic EL device 1 as a display device. A screen displayed on the organic EL device 100 is scrolled by operation of the scroll buttons 3002.

Figure 13:
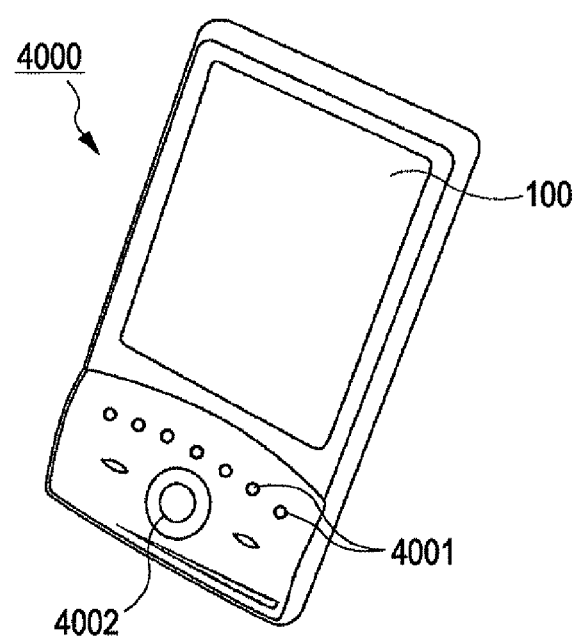
FIG. 13 is a perspective view illustrating other electronic apparatus to which the organic EL device related to the invention is applied.

FIG. 13 shows a PDA (Personal Digital Assistant) to which the light emitting device according to this embodiment is applied. The PDA 4000 includes a plurality of operational buttons 4001, a power supply switch 4002, and an organic EL device 100 as a display device. Various kinds of information such as an address book or a schedule book are displayed on the organic EL device 100 by operation of the power supply switch 4002.

In addition to the electronic apparatuses shown in FIGS. 11 to 13, examples of electronic apparatuses to which the organic EL device according to the invention includes a digital still camera, a television, a video camera, a car navigation, a pager, an electronic pocket book, an electronic paper, a calculator, a word processor, a workstation, a television phone, a POS terminal, a video playback apparatus, and an apparatus having a touch panel.

The entire disclosure of Japanese Patent Application No. 2008-127744, filed May 14, 2008 is expressly incorporated by reference herein.

What is claimed is:

1. A light emitting device comprising:
 a light emitting element which includes a first electrode layer, a second electrode layer, and a light emitting function layer disposed between the first electrode and the second electrode;
 a reflection layer which reflects light emitted from the light emitting function layer toward the light emitting function layer; and
 a translucent transflective layer which is disposed opposite the reflection layer with the light emitting function layer interposed therebetween to reflect some of the light emitted from the light emitting function layer toward the light emitting function layer and to transmit the remainder of the light,
 wherein the translucent transflective layer is disposed between a first layer having a refractive index n1 and being disposed on a side of the reflection layer and a second layer having a refractive index n2 (where n2<n1) and being disposed opposite the first layer, the second layer directly contacts the translucent transflective layer.

2. The light emitting device according to claim 1, wherein the first layer includes the whole or a part of the light emitting function layer.

3. The light emitting device according to claim 2,
 wherein the translucent transflective layer includes the second electrode layer and serves as cathode, and
 wherein the first layer includes at least one of an electron transport layer and an electron injection layer as a part of the light emitting function layer.

4. The light emitting device according to claim 1, wherein an optical distance from the reflection layer to an interface opposite the reflection layer in the translucent transflective layer is determined on the basis of d calculated by Expression (1):

$$2d+\phi_D+\phi_U=m\lambda \qquad (1),$$

where $\lambda$ is a wavelength set as a resonance target, $\phi_D$ is a phase change when light having a wavelength $\lambda$ and traveling from the light emitting function layer to the reflection layer is reflected from the reflection layer, and $\phi_U$ is a phase change when light having a wavelength $\lambda$ and traveling from the light emitting function layer to the translucent transflective layer is reflected from the translucent transflective layer, and m is a positive integer.

5. The light emitting device according to claim 1, wherein the thickness of the translucent transflective layer is in the range of 5 to 20 [nm].

6. The light emitting device according to claim 1, wherein the second layer is made of a material having a light transmitting property.

7. The light emitting device according to claim 1,
 wherein a plurality of the light emitting elements are provided and the plurality of light emitting elements each correspond to a peculiar light emission color, and
 wherein the thickness of the second layer is set so that a half width of a spectrum of light transmitting through the translucent transflective layer and having the light emission color is narrowed.

8. The light emitting device according to claim 7, further comprising a passivation layer which is disposed opposite the reflection layer with the translucent transflective layer interposed therebetween and prevents one of water and oxygen from entering the light emitting element, wherein the thickness of the passivation layer is set so that the half width is narrowed.

9. An electronic apparatus comprising the light emitting device according to claim 1.

10. A light emitting device comprising:

a light emitting element which includes a first electrode layer, a second electrode layer, and a light emitting function layer disposed between the first electrode and the second electrode;

a reflection layer which reflects light emitted from the light emitting function layer toward the light emitting function layer; and a translucent transflective layer which is disposed opposite the reflection layer with the light emitting function layer interposed therebetween to reflect some of the light emitted from the light emitting function layer toward the light emitting function layer and to transmit the remainder of the light, wherein the translucent transflective layer is centered between a high refractive index layer having a refractive index n3 and being disposed on a side of the reflection layer and an inert gas having a refractive index n4 (where n4<n3) and being disposed opposite the high refractive index layer, the inert gas directly contacts the translucent transflective layer.

* * * * *